United States Patent
Ramian et al.

(10) Patent No.: US 12,416,665 B2
(45) Date of Patent: Sep. 16, 2025

(54) MEASUREMENT SYSTEM AND METHOD OF DETERMINING A NOISE FIGURE OF A DEVICE UNDER TEST

(71) Applicant: Rohde & Schwarz GmbH & Co. KG, Munich (DE)

(72) Inventors: Florian Ramian, Munich (DE); Karolin Werthmueller, Munich (DE); Andreas Lagler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 228 days.

(21) Appl. No.: 18/464,124

(22) Filed: Sep. 8, 2023

(65) Prior Publication Data

US 2025/0085334 A1    Mar. 13, 2025

(51) Int. Cl.
*G01R 31/28* (2006.01)

(52) U.S. Cl.
CPC ................ *G01R 31/2832* (2013.01)

(58) Field of Classification Search
None
See application file for complete search history.

(56) References Cited

U.S. PATENT DOCUMENTS

| | | | |
|---|---|---|---|
| 10,761,134 B2 * | 9/2020 | Lagler | G01R 31/2879 |
| 11,874,312 B1 * | 1/2024 | Lagler | G01R 31/31709 |
| 12,235,299 B2 * | 2/2025 | Roth | G01R 31/31721 |
| 2023/0003782 A1 * | 1/2023 | Iwai | G01R 29/26 |
| 2023/0280373 A1 * | 9/2023 | Ramian | G01R 13/0218 324/76.39 |
| 2025/0093450 A1 * | 3/2025 | Ramian | G01R 35/00 |

* cited by examiner

*Primary Examiner* — Jermele M Hollington
(74) *Attorney, Agent, or Firm* — CHRISTENSEN O'CONNOR JOHNSON KINDNESS PLLC

(57) ABSTRACT

A measurement system for determining a noise figure of a device under test is described. The measurement system determines a first total error power based on the output signal by a first noise canceling technique, wherein the first total error power includes systematic errors originating in the device under test and in the measurement system. The measurement system determines a second total error power based on the output signal by a different, second noise canceling technique. The second total error power includes systematic errors originating in the measurement system. The second total error power further includes noise originating in the device under test and in the measurement system outside of the measurement instrument. The measurement system is configured to subtract the first total error power from the second total error power, thereby obtaining an external noise power.

20 Claims, 3 Drawing Sheets

MEASUREMENT SYSTEM AND METHOD OF DETERMINING A NOISE FIGURE OF A DEVICE UNDER TEST

FIELD OF THE DISCLOSURE

Embodiments of the present disclosure generally relate to a measurement system for determining a noise figure of a device under test. Embodiments of the present disclosure further relate to a method of determining a noise figure of a device under test.

BACKGROUND

An important figure of merit for the performance of an electronic device under test is the noise figure of the device under test, i.e. the noise generated by the device under test measured over a certain frequency band.

Different techniques to obtain the noise figure of an electronic device under test are known in the art. Typically, the noise generated by the measurement instrument itself is compensated using a second stage calibration or correction.

These approaches usually require a re-cabling of the measurement setup in order to perform the second stage calibration or correction, thereby increasing the time necessary for performing measurements.

However, if the second stage calibration or correction is not repeated regularly, the obtained measurement results may be inaccurate due to the noise generated by the measurement instrument changing over time, e.g. due to thermal effects.

Thus, there is a need for a measurement system and a method of determining a noise figure of a device under test that allow for testing devices under test in a time-efficient and accurate manner.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a measurement system for determining a noise figure of a device under test. In an embodiment, the measurement system comprises a measurement instrument having an analysis circuit. The analysis circuit is configured to receive an output signal of the device under test. The analysis circuit is configured to determine a first total error power based on the output signal by a first noise canceling technique, wherein the first total error power comprises systematic errors originating in the measurement system. The analysis circuit is configured to determine a second total error power based on the output signal by a second noise canceling technique, wherein the second noise canceling technique differs from the first noise canceling technique. The second total error power comprises systematic errors originating in the measurement system. The second total error power further comprises noise originating in the device under test and in the measurement system outside of the measurement instrument. The analysis circuit is configured to subtract the first total error power from the second total error power, thereby obtaining an external noise power.

Aspects of the present disclosure are based on the idea to use two different noise canceling techniques. The first noise canceling technique removes all noise components, such that only systematic errors remain in the first total error power. The second noise canceling technique removes the noise generated by the measurement instrument itself.

Accordingly, by subtracting the first total error power from the second total error power, the resulting external noise power comprises only noise originating outside of the measurement instrument, for example in the device under test.

Thus, the noise figure of the device under test can be determined based on the external noise power without having to rearrange the measurement setup, i.e. without having to re-cable any measurement equipment. Thus, the time necessary for performing measurements on the device under test is reduced significantly.

In some embodiments, the measurement system is capable of deriving numbers of interest, internal noise (i.e. noise originating in the measurement instrument) and external noise (i.e. noise originating outside of the measurement instrument) from the same measurements without adaptations of the measurement setup being necessary.

Further, changes of the noise generated by the measurement instrument over time, e.g. due to thermal effects, are efficiently compensated, as these changes equally influence both the first total error power and the second error power. Accordingly, the changes of the noise generated by the measurement instrument over time cancel in the external noise power determined.

Thus, embodiments of the measurement system allow for determining the noise figure of the device under test with enhanced precision even if several measurements are conducted sequentially.

According to an aspect of the present disclosure, the first noise canceling technique is, for example, an IQ averaging technique. The IQ averaging technique removes noise irrespective of its origin, i.e. the IQ averaging technique removes noise originating in the measurement instrument, in the measurement system outside of the measurement, and in the device under test. Accordingly, only systematic errors remain in the first total error power (provided that the number of averages is large enough). However, it is to be understood that the first noise canceling technique may be any other suitable averaging technique that is configured to remove noise irrespective of its source.

Therein and in the following, the term "IQ averaging technique" is understood to denote that samples belonging to the same constellation point are averaged. Each sample is a vector having an in-phase value (I-value) and a quadrature value (Q-value). By averaging over vectors belonging to the same constellation point, noise contributions to the vectors cancel irrespective of their origin.

In an embodiment of the present disclosure, the second noise canceling technique is an IQ noise canceling technique or a cross-correlation technique. In general, the IQ noise canceling technique and the cross-correlation technique are configured to selectively remove noise generated by the measurement instrument itself. Accordingly, the second total error power is free of noise generated by the measurement instrument.

The IQ noise canceling technique and the cross-correlation technique are explained in more detail below.

According to another aspect of the present disclosure, the measurement system further comprises, for example, a signal generator, wherein the signal generator is connectable to an input of the device under test. In some embodiments, the signal generator is configured to generate and output a modulated input signal. Thus, the device under test can be tested under real-world conditions, namely with the modulated input signal applied to the input of the device under test.

The signal generator may be an external signal generator established separately from the measurement instrument. In other words, the external signal generator may provided in a different housing than the measurement instrument. Alternatively, the signal generator may be integrated into the measurement instrument, i.e. in the same housing as the analysis circuit.

In a further embodiment of the present disclosure, the signal generator is connectable to the analysis circuit directly. The analysis circuit is configured to determine a first generator error power based on the modulated input signal by the first noise canceling technique, wherein the first generator error power comprises systematic errors originating in the signal generator and in the remaining measurement system. The analysis circuit is configured to determine a second generator error power based on the modulated input signal by the second noise canceling technique, wherein the second generator error power comprises systematic errors originating in the signal generator and in the remaining measurement system. The second generator error power further comprises noise originating in the signal generator and in the remaining measurement system outside of the measurement instrument. The analysis circuit is configured to subtract the first generator error power from the second generator error power, thereby obtaining a signal generator noise power.

As explained above, the first noise canceling technique removes all noise components, such that only systematic errors remain in the first generator error power. The second noise canceling technique removes the noise generated by the measurement instrument itself. Accordingly, by subtracting the first generator error power from the second generator error power, the resulting generator noise power comprises only noise originating outside of the measurement instrument, for example in the signal generator.

A further aspect of the present disclosure provides that the analysis circuit is configured, for example, to correct the external noise power based on the signal generator noise power. In other words, the external noise power is corrected for the noise generated by the signal generator, such that the noise figure of the device under test can be determined with enhanced precision.

In some embodiments, the measurement system is configured to determine a gain of the device under test, wherein the analysis circuit is configured to scale the signal generator noise power based on the determined gain. In general, any noise generated by the signal generator is multiplied by the gain of the device under test. Thus, by scaling the signal generator noise power based on the determined gain, the noise generated by the signal generator is correctly taken into account for correcting the external noise power.

In some embodiments, the signal generator noise power is multiplied with the determined gain, and the resulting product is subtracted from the external noise power, thereby obtaining a corrected external noise power.

In an embodiment of the present disclosure, the signal generator is connected to the analysis circuit, wherein the analysis circuit is configured to receive the modulated input signal. In some embodiments, the analysis circuit is configured to determine the external noise power based on the modulated input signal. In other words, the modulated input signal may serve as a reference signal for determining the external noise power.

In a further embodiment of the present disclosure, the measurement system further comprises a visualization circuit, wherein the visualization circuit is configured to generate visualization data based on the external noise power determined. Accordingly, information with respect to the external noise power (and thus information regarding the noise figure of the device under test) is presented to a user in an illustrative way.

According to an aspect of the present disclosure, the measurement system further comprises, for example, a display, the display being configured to display the visualization data. The display may be integrated into the measurement instrument. Alternatively, the display may be established separately from the measurement instrument, e.g. as a standalone display such as a computer monitor.

The determined external noise power may comprise a single value for the whole bandwidth of the output signal and/or a plurality of values for the bandwidth of the output signal. For example, the determined external noise power may comprise an average noise power, wherein the noise power is averaged over the bandwidth of the output signal. As another example, the determined external noise power may be a function describing the noise power in dependence of frequency over the bandwidth of the output signal.

Embodiments of the present disclosure further provide a method of determining a noise figure of a device under test. In an embodiment, the method comprises the steps of:

providing the device under test and a measurement instrument having a analysis circuit, the analysis circuit being configured to perform a first noise canceling technique and a second noise canceling technique, wherein the second noise canceling technique differs from the first noise canceling technique;

connecting the device under test to the analysis circuit;

receiving, by the analysis circuit, an output signal of the device under test;

determining, by the analysis circuit, a first total error power based on the output signal by the first noise canceling technique, wherein the first total error power comprises systematic errors originating in the measurement system;

determining, by the analysis circuit, a second total error power based on the output signal by the second noise canceling technique, wherein the second total error power comprises systematic errors originating in the measurement system, wherein the second total error power further comprises noise originating in the device under test and in the measurement system outside of the measurement instrument; and subtracting, by the analysis circuit, the first total error power from the second total error power, thereby obtaining an external noise power.

The measurement system according to any one of the embodiments described above may configured to perform the method of determining a noise figure of a device under test.

Regarding the advantages and further properties of the method, reference is made to the explanations given above with respect to the measurement system, which also hold for the method and vice versa.

According to an aspect of the present disclosure, the first noise canceling technique is, for example, an IQ averaging technique. The IQ averaging technique removes noise irrespective of its origin, i.e. the IQ averaging technique removes noise originating in the measurement instrument, in the measurement system outside of the measurement, and in the device under test. Accordingly, only systematic errors remain in the first total error power (provided that the number of averages is large enough). However, it is to be understood that the first noise canceling technique may be any other suitable averaging technique that is configured to remove noise irrespective of its source.

According to another aspect of the present disclosure, the second noise canceling technique is, for example, an IQ noise canceling technique or a cross-correlation technique. In general, the IQ noise canceling technique and the cross-correlation technique are configured to selectively remove noise generated by the measurement instrument itself. Accordingly, the second total error power is free of noise generated by the measurement instrument.

The method may further comprise the steps of: providing a signal generator; directly connecting the signal generator to the analysis circuit; generating, by the signal generator, a modulated input signal; determining, by the analysis circuit, a first generator error power based on the modulated input signal by the first noise canceling technique, wherein the first generator error power comprises systematic errors originating in the signal generator and in the remaining measurement system; and determining, by the analysis circuit, a second generator error power based on the modulated input signal by the second noise canceling technique. In some embodiments, the second generator error power comprises systematic errors originating in the signal generator and in the remaining measurement system, and the second generator error power further comprises noise originating in the signal generator and in the remaining measurement system outside of the measurement instrument. The method further comprises subtracting, by the analysis circuit, the first generator error power from the second generator error power, thereby obtaining a signal generator noise power.

As explained above, the first noise canceling technique removes all random noise components, such that only systematic errors remain in the first generator error power. The second noise canceling technique removes the random noise generated by the measurement instrument itself.

Accordingly, by subtracting the first generator error power from the second generator error power, the resulting generator noise power comprises only noise originating outside of the measurement instrument, for example in the signal generator.

In an embodiment of the present disclosure, the external noise power is corrected based on the signal generator noise power by the analysis circuit. In other words, the external noise power is corrected for the noise generated by the signal generator, such that the noise figure of the device under test can be determined with enhanced precision.

A gain of the device under test may be determined by the measurement system, wherein the signal generator noise power is scaled based on the determined gain. In general, any noise generated by the signal generator is multiplied by the gain of the device under test. Thus, by scaling the signal generator noise power based on the determined gain, the noise generated by the signal generator is correctly taken into account for correcting the external noise power.

In some embodiments, the signal generator noise power is multiplied with the determined gain, and the resulting product is subtracted from the external noise power, thereby obtaining a corrected external noise power.

Another aspect of the present disclosure provides that the external noise power is, for example, visualized on a display. Accordingly, information with respect to the external noise power (and thus information regarding the noise figure of the device under test) is presented to a user in an illustrative way.

In an embodiment of the present disclosure, the measurement system comprises a signal generator, wherein the signal generator is connected to an input of the device under test, wherein a modulated input signal is generated by the signal generator, and wherein the modulated input signal is forwarded to the input of the device under test. Thus, the device under test can be tested under real-world conditions, namely with the modulated input signal applied to the input of the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
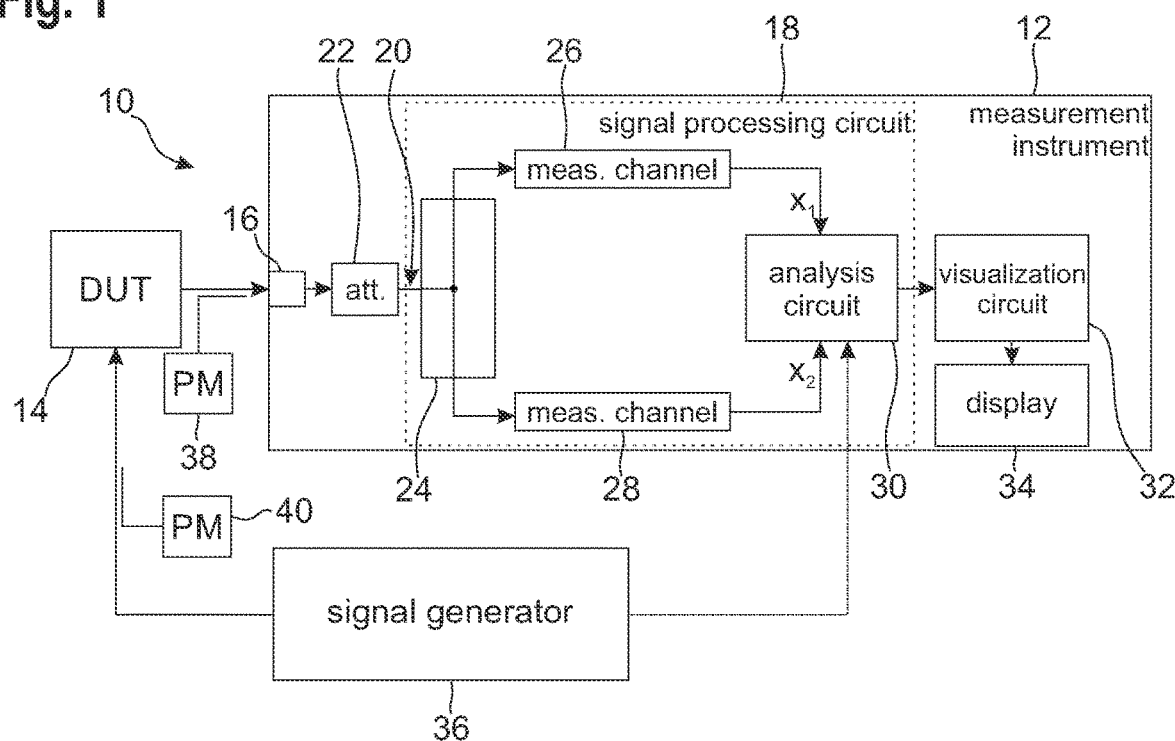
FIG. 1 schematically shows a measurement system according to an embodiment of the present disclosure.

FIG. 1 schematically shows a measurement system 10 comprising a measurement instrument 12 and a device under test 14 in accordance with an embodiment of the present disclosure. In general, the measurement instrument 12 is configured to analyze an input signal received from the device under test 14 in order to analyze certain properties of the device under test 14, for example a noise figure of the device under test 14.

For example, the measurement instrument 12 is a signal analyzer, a spectrum analyzer, a noise figure meter, or a vector network analyzer. However, it is to be understood that the measurement instrument 12 may be any other suitable type of measurement instrument.

The device under test 14 may be established as any electronic device that is configured to process a radio-frequency (RF) signal. For example, the device under test 14 comprises one or several electronic circuits processing an RF signal, wherein the performance of the electronic circuit(s) is assessed by the measurement instrument 12. In some embodiments, the device under test 14 may be established as an amplifier, a filter, a mixer, or as any other electronic two-port device.

The device under test 14 is connected with the measurement instrument 12. In some embodiments, an output of the device under test 14 is connected to a signal input 16 of the measurement instrument 12 such that an electric signal output by the device under test 14 is transmitted from the device under test 14 to the measurement instrument 12, for example via cable.

In the embodiment shown, the measurement instrument 12 comprises a signal processing circuit 18 having a measurement input 20 that is connected to the signal input 16, optionally via an attenuator 22. The signal processing circuit 18 comprises a splitter circuit 24, a first measurement channel 26 connected to the splitter circuit 24, a second measurement channel 28 connected to the splitter circuit 24, and an analysis circuit 30 being connected to the measurement channels 26, 28.

The first measurement channel 26 is connected to the signal input 16 via the splitter circuit 24, such that the first measurement channel 26 receives the output signal of the device under test 14. The first measurement channel 26 is configured to process the output signal of the device under test 14, thereby obtaining a first measurement signal $x_1$.

The first measurement signal $x_1$ may be a time domain signal or a frequency domain signal. In the following, it is assumed without restriction of generality that the first measurement signal $x_1$ is an IQ data signal.

Likewise, the second measurement channel 28 is connected to the signal input 16 via the splitter circuit 24, such that the second measurement channel 26 receives the output signal of the device under test 14. The second measurement channel 28 is configured to process the output signal of the device under test 14, thereby obtaining a second measurement signal $x_2$.

The second measurement signal $x_2$ may be a time domain signal or a frequency domain signal. In the following, it is assumed without restriction of generality that the first measurement signal $x_2$ is an IQ data signal.

The measurement channels 26, 28 may be functionally identical, i.e. may have the same electronic components. Accordingly, the measurement signals $x_1$, $x_2$ correspond to a signal received via the signal input 16 that has been independently processed by the functionally identical measurement channels 26, 28 being arranged in parallel.

The measurement instrument 12 further comprises a visualization circuit 32 that is connected to the analysis circuit 30. In the example embodiment shown in FIG. 1, the measurement instrument 12 further comprise an integrated display 34. Alternatively, the measurement instrument 12 may be connectable to a display that is established separately from the measurement instrument.

In the embodiment shown, the measurement system 10 further comprises a signal generator 36 that is connected to an input of the device under test 14. In general, the signal generator 36 includes circuitry configured to generate a modulated signal, for example an arbitrary modulated signal. For example, the signal generator 36 is established as an arbitrary waveform generator.

The signal generator 36 may further be connected with the analysis circuit 30, e.g. via a reference signal input of the measurement instrument 12. It is noted that it is also conceivable that the signal generator 36 may be integrated into the measurement instrument 12.

Optionally, the measurement system 10 may further comprise a first power meter 38 that is provided between the output of the device under test 14 and the signal input 16. Moreover, the measurement system 10 may comprise a second power meter 40 that is provided between the signal generator 36 and the input of the device under test 14.

Figure 2:
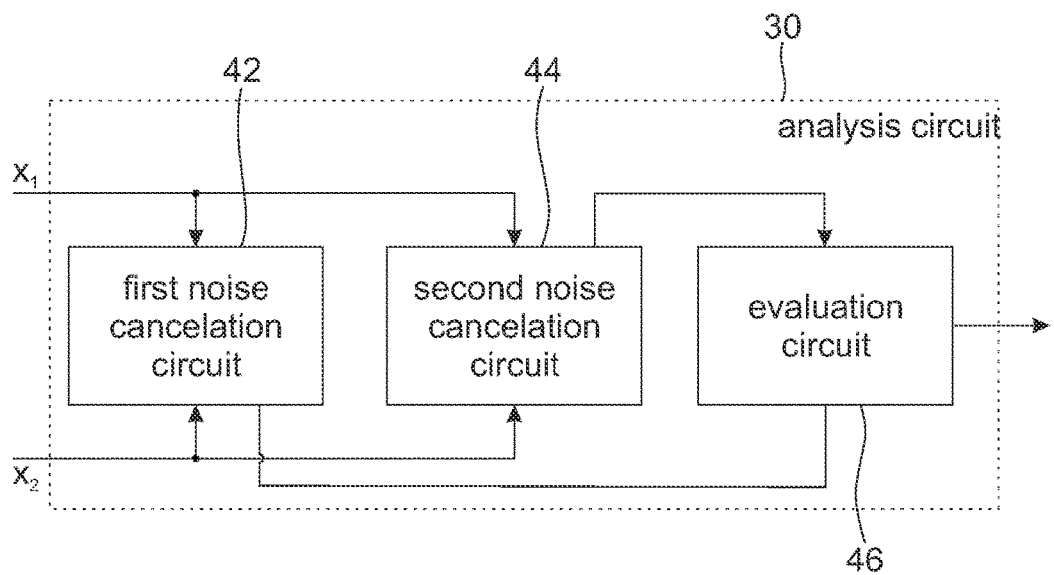
FIG. 2 shows an example of an analysis circuit of the measurement system of FIG. 1 in more detail.

FIG. 2 shows the analysis circuit 30 in more detail. The analysis circuit 30 comprises a first noise cancelation circuit 42 being connected to the measurement channels 26, 28. Accordingly, the first noise cancelation circuit 42 receives the measurement signals $x_1$, $x_2$. The first noise cancelation circuit 42 is configured to perform a first noise canceling technique, as will be described in more detail below.

The analysis circuit 30 further comprises a second noise cancelation circuit 44 being connected to the measurement channels 26, 28. Accordingly, the second noise cancelation circuit 44 receives the measurement signals $x_1$, $x_2$. The second noise cancelation circuit 44 is configured to perform a second noise canceling technique, as will be described in more detail below.

The analysis circuit 30 further comprises an evaluation circuit 46 that is connected to the first noise cancelation circuit 42 and the second noise cancelation circuit 44 so as to receive output signals of the cancelation circuits 42, 44.

Figure 3:
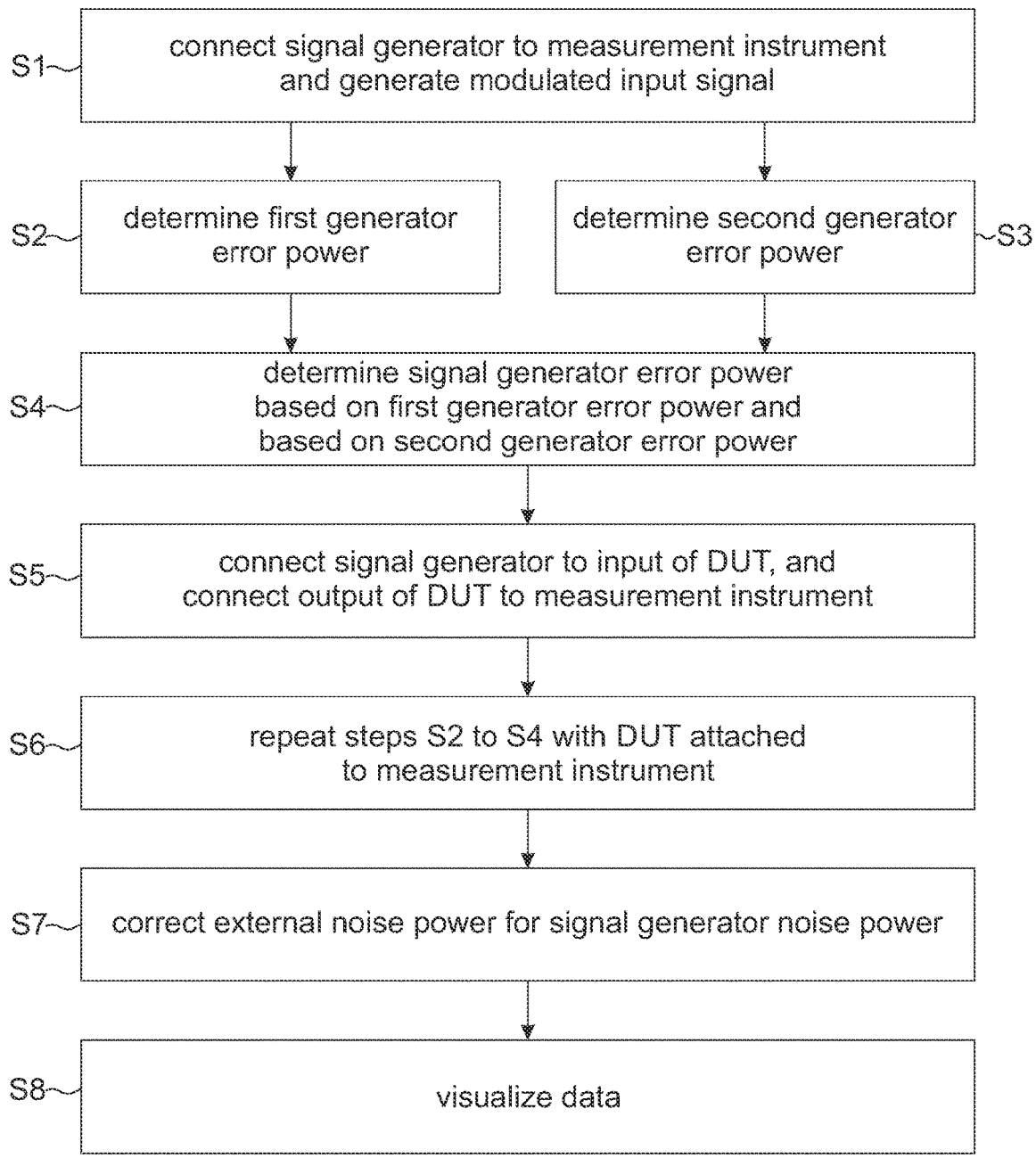
FIG. 3 shows a flow chart of a method of determining a noise figure of a device under test according to an embodiment of the present disclosure.

The measurement system 10 is configured to perform a method of determining a noise figure of the device under test 14. An example of the method is described in the following with reference to FIG. 3.

In the following, it is assumed without restriction of generality that the signal generator 36 is established separately from the measurement instrument 12.

The signal generator 36 is connected to the signal input 16 of the measurement instrument 12 directly, and a modulated input signal is generated by the signal generator 36 (step S1).

The modulated input signal is split by the splitter circuit 24 and forwarded to the measurement channels 26, 28. The modulated input signal is processed by the measurement channels 26, 28, thereby obtaining the measurement signals $x_1$, $x_2$. Optionally, the modulated input signal may also be forwarded to the analysis circuit 30 and may serve as a reference signal for performing the measurements described below.

A first generator error power is determined by the first noise cancelation circuit 42 based on the modulated input signal by the first noise canceling technique (step S2). In some embodiments, the first generator error power is determined based on the measurement signals $x_1$, $x_2$. The first noise canceling technique may be an IQ averaging technique.

The IQ averaging technique removes noise irrespective of its origin, i.e. the IQ averaging technique removes noise originating in the measurement instrument 12, in the signal generator 36 and, if further electronic components are provided between the signal generator 36 and the signal input 16, in the remaining measurement system 10 outside of the measurement instrument 12.

Accordingly, only systematic errors remain in the first total error power.

Thus, the first generator error power comprises systematic errors originating in the signal generator 36 and in the remaining measurement system 10, namely in the measurement instrument 12, for example in the measurement channels 26, 28.

A second generator error power is determined by the second noise cancelation circuit 44 based on the modulated input signal by the second noise canceling technique (step S3).

In general, the second noise canceling technique is configured to selectively remove noise originating in the measurement instrument 12, for example in the measurement channels 26, 28.

Thus, the second generator error power comprises systematic errors originating in the signal generator 36 and in the remaining measurement system 10, namely in the measurement instrument 12, for example in the measurement channels 26, 28.

The second generator error power further comprises noise originating in the signal generator 36 and in the remaining measurement system 10 outside of the measurement instrument 12. For example, the second noise canceling technique may be a so-called cross-correlation technique, wherein a combined average of the measurement signals $x_1$, $x_2$ is performed.

Examples of such cross-correlation techniques and the corresponding structures of the measurement channels 26, 28 are described in patent applications EP 4 145 151 A1 and EP 4 145 152 A1, which are hereby included in their entirety by reference.

As another example, the second noise canceling technique may be an IQ noise canceling technique, which is described in more detail below in the section "IQ noise cancelation".

The first generator error power and the second generator error power are forwarded to the evaluation circuit. The first generator error power is subtracted from the second generator error power by the evaluation circuit, thereby obtaining a signal generator noise power (step S4).

As explained above, the first noise canceling technique removes all noise components, such that only systematic errors remain in the first generator error power. The second noise canceling technique removes the noise generated by the measurement instrument 12 itself.

By subtracting the first generator error power from the second generator error power, all systematic errors and all noise except for noise originating outside of the measurement instrument 12, namely in the signal generator 36, cancel. Thus, the obtained signal generator noise power is a measure for the noise generated by the signal generator 36.

The signal generator 36 is connected to the input of the device under test 14, and the output of the device under test 14 is connected to the signal input 16 (step S5).

Steps S2 to S4 are repeated with the device under test 14 being attached to the measurement instrument 12 (step S6).

Therein, a first total error power is determined based on the output signal by the first noise cancelation circuit 42 via the first noise canceling technique, wherein the first total error power comprises systematic errors originating in the measurement system 10. A second total error power is determined by the second noise cancelation circuit 44 via the second noise canceling technique. The second total error power comprises systematic errors originating in the measurement system 10. The second total error power further comprises noise originating in the device under test 14 and in the measurement system 10 outside of the measurement instrument 12, for example in the signal generator 36. The first total error power is subtracted from the second total error power by the evaluation circuit 46, thereby obtaining an external noise power.

By subtracting the first total error power from the second total error power, all systematic errors and all noise except for noise originating outside of the measurement instrument 12, namely in the signal generator 36, cancel. Thus, the external noise power comprises noise generated by the device under test 14 and noise generated by the signal generator 36.

The external noise power determined is corrected based on the signal generator noise power determined, thereby obtaining a corrected external noise power (step S7).

In some embodiments, a gain of the device under test 14 is determined. For example, the gain may be determined by measuring a power of the modulated input signal upstream of the device under test 14 by the second power meter 40, as well as a power of the output signal of the device under test 14 downstream of the device under test 14 by the first power meter 38.

By comparing the measured power of the output signal with the measured power of the modulated input signal, the gain of the device under test 14 can be determined.

In general, any noise generated by the signal generator 36 is multiplied by the gain of the device under test 14. Thus, by scaling the signal generator noise power based on the determined gain, the noise generated by the signal generator 36 is correctly taken into account for correcting the external noise power.

In some embodiments, the signal generator noise power is multiplied with the determined gain, and the resulting product is subtracted from the external noise power, thereby obtaining the corrected external noise power.

Accordingly, the corrected external noise power corresponds to the noise generated by the device under test 14. In other words, the corrected external noise power may be the noise figure of the device under test 14.

Visualization data associated with the first total noise power, the second total noise power, the external noise power, the corrected noise power, the first generator error power, the second generator error power, and/or the signal generator error power is generated by the visualization circuit 32 and displayed on the display 34 (step S8).

Accordingly, numbers of interest, internal noise (i.e. noise originating in the measurement instrument 12), and/or external noise (i.e. noise originating outside of the measurement instrument 12) are determined and displayed on the display 34.

In general, the displayed quantities, for example the external noise and/or the corrected external noise, may be a single value for the whole bandwidth of the output signal of the device under test 14 and/or a plurality of values for the bandwidth of the output signal of the device under test 14. For example, the displayed quantities may comprise an average noise/error power, wherein the noise/error power is averaged over the bandwidth of the output signal.

Figure 4:
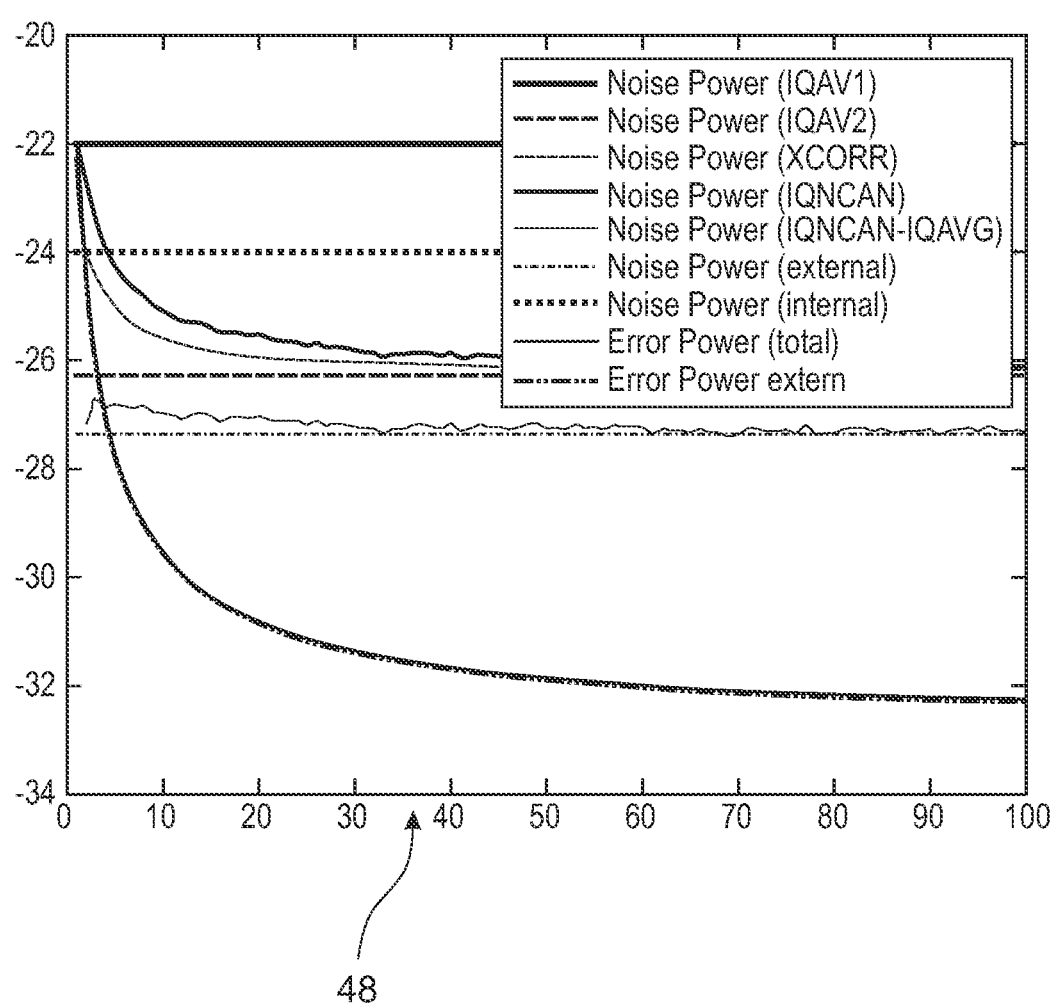
FIG. 4 shows a diagram illustrating different error measures obtained by the method of FIG. 3.

An example diagram 48 being displayed on the display is shown in FIG. 4. In this example, the displayed quantities are functions describing the noise/error power in dependence of frequency over the bandwidth of the output signal.

IQ Noise Cancelation

In the following, an example embodiment of the IQ noise canceling technique mentioned above is described.

The output signal generated by the device under test 14 is received by the signal input 16 and is forwarded to the first noise cancelation circuit 42. A DUT noise contribution to noise of the output signal is determined, wherein the DUT noise contribution is associated with noise originating from the device under test 14.

The DUT noise contribution may be determined by any suitable technique, for example by any suitable technique known from the state of the art. For example, the techniques described in granted U.S. Pat. No. 10,761,134 B2 may be used in order to determine the DUT noise contribution. U.S. Pat. No. 10,761,134 B2 is hereby incorporated by reference in its entirety.

The DUT noise contribution may be determined only once in a first set of measurements before the further steps of the signal processing described below are performed. The results of this first set of measurements, i.e. the DUT noise contribution, can then be used for any other measurement conducted by the signal processing method described below.

A noise level of the output signal is reduced to a noise level of the DUT noise contribution determined, thereby obtaining a noise-reduced output signal. In other words, noise originating from all sources except for the device under test 14 is selectively removed from the digital input signal, such that the noise level of the noise-reduced output signal corresponds to the noise level of the DUT noise contribution.

This can be achieved according to a plurality of different variants that are described in the following.

According to a first embodiment, an IQ averaging technique is applied to the digital input signal until the noise level of the input signal matches the noise level of the DUT noise contribution. IQ averaging techniques are per se well known in the prior art, and are thus not explained in more detail herein.

Usually, these averaging techniques are applied until the noise level is reduced to a minimum. However, this cancels all noise regardless of the source of the noise.

Due to the knowledge of the DUT noise level determined above, the IQ averaging technique is applied only long enough such that the noise level of the digital input signal is reduced to the noise level of the DUT noise contribution. This way, the appropriate noise level of the noise-reduced output signal can be obtained without further intermediate steps.

According to a second embodiment, the IQ averaging technique is applied to the digital input signal until the noise level is reduced to a minimum, thereby obtaining a preliminary noise-reduced signal. The determined DUT noise contribution may then be added to the preliminary noise-reduced signal, thereby obtaining the noise-reduced output signal.

In other words, according to the second embodiment, noise is (substantially) completely removed from the output signal by the IQ averaging technique. Afterwards, the determined DUT noise contribution is re-added to the preliminary noise-reduced signal, such that the noise level of the noise-reduced output signal corresponds to the noise level of the DUT noise contribution.

The determined DUT noise contribution may correspond to a white Gaussian noise distribution. In other words, the DUT noise contribution may be modelled as additive white Gaussian noise. The white Gaussian noise distribution is added to the preliminary noise-reduced signal in order to obtain the noise-reduced output signal.

According to a third embodiment, a preliminary noise-reduced signal is obtained as described above. The preliminary noise-reduced signal is subtracted from the digital input signal, thereby obtaining a total noise signal. Accordingly, the total noise signal corresponds to the digital input signal, but with the wanted signal (also called "useful signal") removed.

In some embodiments, the total noise signal is weighted with a weighting factor or a weighting function, thereby obtaining a weighted noise signal. Therein, the weighting factor or weighting function is determined based on the determined DUT noise contribution. In some embodiments, the weighting factor or weighting function is chosen such that the weighted noise signal corresponds to the DUT noise contribution.

The weighted noise signal is added to the preliminary noise-reduced signal, thereby obtaining the noise-reduced output signal.

In other words, according to the third embodiment, noise is (substantially) completely removed from the output signal by the IQ averaging technique. Afterwards, the determined weighted noise signal is re-added to the preliminary noise-reduced signal, such that the noise level of the noise-reduced output signal corresponds to the noise level of the DUT noise contribution.

Summarizing, the noise-reduced output signal obtained by any of the variants described above has a noise level that corresponds to the noise level of the DUT noise contribution, i.e. with the influence of the measurement instrument 12 removed.

Certain embodiments disclosed herein include systems, apparatus, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

In some embodiments, one or more of the components described above, such as the signal processing circuit 18, visualization circuit 32, etc., include circuitry programmed to carry out one or more steps of any of the methods disclosed herein. In some embodiments, one or more computer-readable media associated with or accessible by such circuitry contains computer readable instructions embodied thereon that, when executed by such circuitry, cause the component or circuitry to perform one or more steps of any of the methods disclosed herein.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a graphical processing unit (GPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

It should now be appreciated that some embodiments of the present disclosure, or portions thereof, have been described in the general context of computer code or machine-useable instructions, including computer-executable instructions such as program modules, being executed by a computing system, or other machine or machines. Some of these embodiments or others may be implemented using a variety of system configurations, including handheld devices, consumer electronics, general-purpose computers, specialty computing devices, etc. Embodiments described herein may also be implemented in distributed computing environments, using remote-processing devices that are linked through a communications network or the Internet.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein. All such combinations or sub-combinations of features are within the scope of the present disclosure.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The embodiments of the invention in which an exclusive property or privilege is claimed are defined as follows:

1. A measurement system for determining a noise figure of a device under test, the measurement system comprising a measurement instrument having an analysis circuit,
   wherein the analysis circuit is configured to receive an output signal of the device under test,
   wherein the analysis circuit is configured to determine a first total error power based on the output signal by a first noise canceling technique, wherein the first total error power comprises systematic errors originating in the measurement system,
   wherein the analysis circuit is configured to determine a second total error power based on the output signal by a second noise canceling technique, wherein the second noise canceling technique differs from the first noise canceling technique, wherein the second total error power comprises systematic errors originating in the measurement system, wherein the second total error power further comprises noise originating in the device under test and in the measurement system outside of the measurement instrument, and
   wherein the analysis circuit is configured to subtract the first total error power from the second total error power, thereby obtaining an external noise power.

2. The measurement system of claim 1, wherein the first noise canceling technique is an IQ averaging technique.

3. The measurement system of claim 1, wherein the second noise canceling technique is an IQ noise canceling technique or a cross-correlation technique.

4. The measurement system of claim 1, further comprising a signal generator, wherein the signal generator is connectable to an input of the device under test, and wherein the signal generator is configured to generate and output a modulated input signal.

5. The measurement system of claim 4, wherein the signal generator is an external signal generator being established separately from the measurement instrument.

6. The measurement system of claim 4, wherein the signal generator is connectable to the analysis circuit directly,
   wherein the analysis circuit is configured to determine a first generator error power based on the modulated input signal by the first noise canceling technique, wherein the first generator error power comprises systematic errors originating in the signal generator and in the remaining measurement system,
   wherein the analysis circuit is configured to determine a second generator error power based on the modulated input signal by the second noise canceling technique, wherein the second generator error power comprises systematic errors originating in the signal generator and in the remaining measurement system, wherein the second generator error power further comprises noise originating in the signal generator and in the remaining measurement system outside of the measurement instrument, and
   wherein the analysis circuit is configured to subtract the first generator error power from the second generator error power, thereby obtaining a signal generator noise power.

7. The measurement system of claim 6, wherein the analysis circuit is configured to correct the external noise power based on the signal generator noise power.

8. The measurement system of claim 7, wherein the measurement system is configured to determine a gain of the device under test, and wherein the analysis circuit is configured to scale the signal generator noise power based on the determined gain.

9. The measurement system of claim 4, wherein the signal generator is connected to the analysis circuit, wherein the analysis circuit is configured to receive the modulated input signal, and wherein the analysis circuit is configured to determine the external noise power based on the modulated input signal.

10. The measurement system of claim 1, further comprising a visualization circuit, wherein the visualization circuit is configured to generate visualization data based on the external noise power determined.

11. The measurement system of claim 10, wherein the measurement system further comprises a display, the display being configured to display the visualization data.

12. The measurement system of claim 1, wherein the determined external noise power comprises a single value for the whole bandwidth of the output signal and/or a plurality of values for the bandwidth of the output signal.

13. A method of determining a noise figure of a device under test, the method comprising the steps of
   providing the device under test and a measurement instrument having a analysis circuit, the analysis circuit being configured to perform a first noise canceling technique and a second noise canceling technique, wherein the second noise canceling technique differs from the first noise canceling technique;
   connecting the device under test to the analysis circuit;
   receiving, by the analysis circuit, an output signal of the device under test;
   determining, by the analysis circuit, a first total error power based on the output signal by the first noise canceling technique, wherein the first total error power comprises systematic errors originating in the measurement system;
   determining, by the analysis circuit, a second total error power based on the output signal by the second noise canceling technique, wherein the second total error power comprises systematic errors originating in the device under test and in the measurement system, wherein the second total error power further comprises noise originating in the device under test and in the measurement system outside of the measurement instrument; and subtracting, by the analysis circuit, the first total error power from the second total error power, thereby obtaining an external noise power.

14. The method of claim 13, wherein the first noise canceling technique is an IQ averaging technique.

15. The method of claim 13, wherein the second noise canceling technique is an IQ noise canceling technique or a cross-correlation technique.

16. The method of claim 13, further comprising the steps of
providing a signal generator;
directly connecting the signal generator to the analysis circuit;
generating, by the signal generator, a modulated input signal;
determining, by the analysis circuit, a first generator error power based on the modulated input signal by the first noise canceling technique, wherein the first generator error power comprises systematic errors originating in the signal generator and in the remaining measurement system;
determining, by the analysis circuit, a second generator error power based on the modulated input signal by the second noise canceling technique, wherein the second generator error power comprises systematic errors originating in the signal generator and in the remaining measurement system, wherein the second generator error power further comprises noise originating in the signal generator and in the remaining measurement system outside of the measurement instrument; and
subtracting, by the analysis circuit, the first generator error power from the second generator error power, thereby obtaining a signal generator noise power.

17. The method of claim 16, wherein the external noise power is corrected based on the signal generator noise power by the analysis circuit.

18. The method of claim 17, wherein a gain of the device under test is determined by the measurement system, and wherein the signal generator noise power is scaled based on the determined gain.

19. The method of claim 13, wherein the external noise power is visualized on a display.

20. The method of claim 13, wherein the measurement system comprises a signal generator, wherein the signal generator is connected to an input of the device under test, wherein a modulated input signal is generated by the signal generator, and wherein the modulated input signal is forwarded to the input of the device under test.

* * * * *